(12) United States Patent
Jeddeloh (10) Patent No.: US 8,127,185 B2
(45) Date of Patent: Feb. 28, 2012

(54) MEMORY DEVICES AND METHODS FOR MANAGING ERROR REGIONS

(75) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 307 days.

(21) Appl. No.: 12/359,014

(22) Filed: Jan. 23, 2009

(65) Prior Publication Data
US 2010/0192041 A1    Jul. 29, 2010

(51) Int. Cl.
*G11C 29/00* (2006.01)
(52) U.S. Cl. ........................ 714/723; 714/718
(58) Field of Classification Search .......... 714/718, 714/723, 736, 819, 704, 710, 746, 702, 724, 714/760, 769, 776, 6.2, 6.11, 6.12, 6.13, 714/6.22, 6.24; 365/201, 222, 230.06, 226, 365/185.33, 230.03; 713/340, 300
See application file for complete search history.

(56) References Cited

U.S. PATENT DOCUMENTS 5,274,646 A    12/1993    Brey et al.
(Continued)

FOREIGN PATENT DOCUMENTS

WO    WO-2010085647 A2    7/2010
(Continued)

OTHER PUBLICATIONS

"International Application Serial No. PCT/US2010/021807, Search Report mailed Aug. 18, 2010", 3 pgs.

(Continued)

*Primary Examiner* — Phung M Chung
(74) *Attorney, Agent, or Firm* — Schwegman, Lundberg & Woessner, P.A.

(57) ABSTRACT

Memory devices and methods are described that include a stack of memory dies and a logic die. Method and devices described include those that provide for repartitioning the stack of memory dies and storing the new partitions in a memory map. Repartitioning in selected configurations allows portions of memory to be removed from use without affecting the rest of the memory device. Additional devices, systems, and methods are disclosed.

19 Claims, 5 Drawing Sheets

U.S. PATENT DOCUMENTS

| | | | |
|---|---|---|---|
| 6,195,304 B1 * | 2/2001 | Eto et al. | 365/222 |
| 7,545,698 B2 * | 6/2009 | Safvi et al. | 365/222 |
| 7,609,561 B2 * | 10/2009 | Cornwell et al. | 365/185.33 |
| 7,929,368 B2 * | 4/2011 | Jeddeloh | 365/222 |
| 2006/0126369 A1 | 6/2006 | Raghuram | |
| 2007/0061612 A1 | 3/2007 | Henderson et al. | |
| 2010/0002512 A1 * | 1/2010 | Cornwell et al. | 365/185.09 |

FOREIGN PATENT DOCUMENTS

| | | |
|---|---|---|
| WO | WO-2010085647 A3 | 10/2010 |

OTHER PUBLICATIONS

"International Application Serial No. PCT/US2010/021807, Written Opinion mailed Aug. 18, 2010", 4 pgs.

* cited by examiner

MEMORY DEVICES AND METHODS FOR MANAGING ERROR REGIONS

TECHNICAL FIELD

Various embodiments described herein relate to apparatus, systems, and methods associated with semiconductor memories.

BACKGROUND

Microprocessor technology has evolved at a faster rate than that of semiconductor memory technology. As a result, a mis-match in performance often exists between the modern host processor and the semiconductor memory subsystem to which the processor is mated to receive instructions and data. For example, it is estimated that some high-end servers idle three out of four clock cycles waiting for responses to memory requests.

In addition, the evolution of software application and operating system technology has increased demand for higher-density memory subsystems as the number of processor cores and threads continues to increase. However, current-technology memory subsystems often represent a compromise between performance and density. Higher bandwidths may limit the number of memory cards or modules that may be connected in a system without exceeding Joint Electron Device Engineering Council (JEDEC) electrical specifications.

Extensions to JEDEC interface standards such as dual data rate (DDR) synchronous dynamic random access memory (SDRAM) have been proposed but may be generally found lacking as to future anticipated memory bandwidths and densities. Weaknesses include lack of memory power optimization and the uniqueness of the interface between the host processor and the memory subsystem. The latter weakness may result in a need to redesign the interface as processor and/or memory technologies change.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made.

Figure 1:
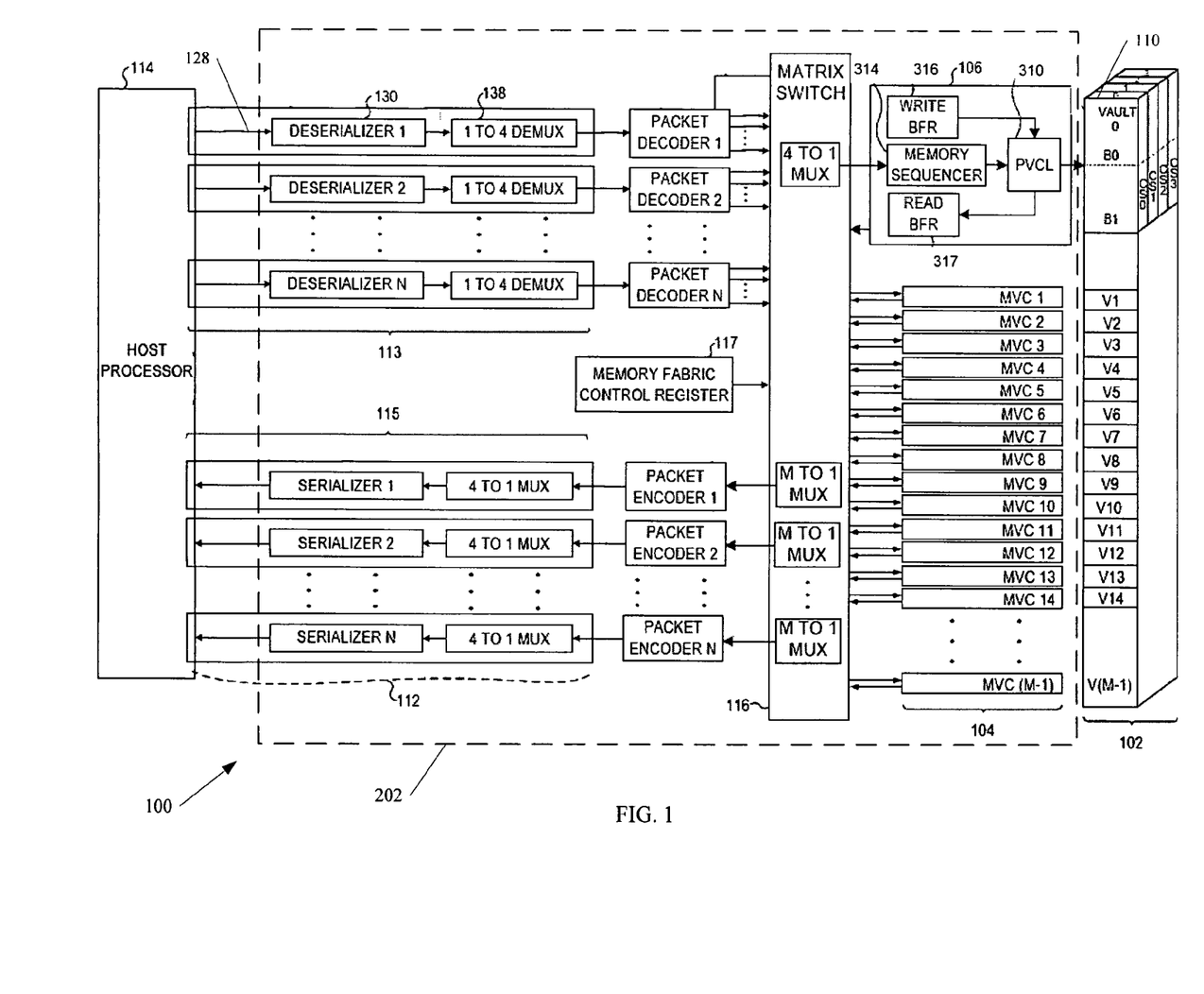
FIG. 1 shows a block diagram of a memory system according to an embodiment of the invention.

FIG. 1 includes a block diagram of a memory device 100 according to various example embodiments of the current invention. The memory device 100 operates to substantially concurrently transfer a plurality of outbound and/or inbound streams of commands, addresses, and/or data between one or more originating devices and/or destination devices (e.g., one or more processors) and a set of stacked-array memory "vaults" 110. Increased memory system density, bandwidth, parallelism, and scalability may result.

Multi-die memory array embodiments aggregate control logic that is normally located on each individual memory array die in previous designs. Subsections of a stacked group of dies, referred to in the present disclosure as memory vaults are shown as example vault 110 in FIG. 1 and as example vault 230 in FIG. 2. The memory vaults shown in the illustrated examples share common control logic. The memory vault architecture strategically partitions memory control logic to increase energy efficiency while providing a finer granularity of powered-on memory banks. Embodiments shown also enable a standardized host processor to memory system interface. The standardized interface may reduce re-design cycle times as memory technology evolves.

Figure 2:
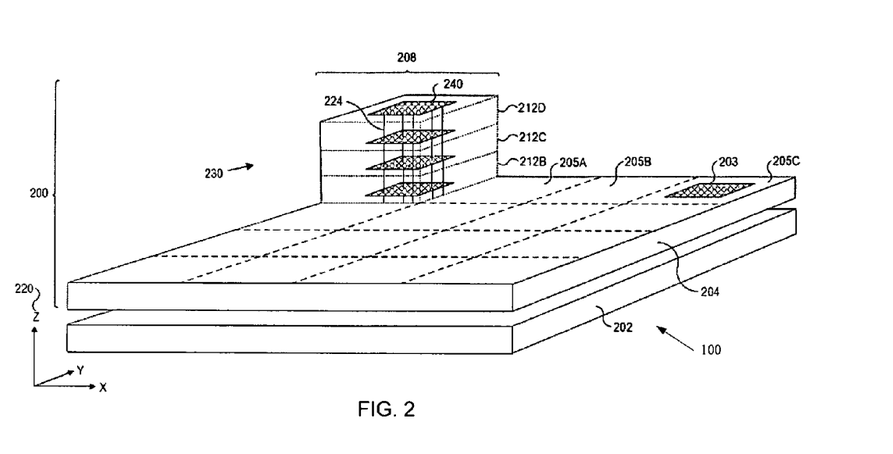
FIG. 2 shows a cut-away conceptual view of a stacked-die 3D memory with a logic die according to an embodiment of the invention.

FIG. 2 is a cut-away conceptual view of a stacked-die 3D memory array 200 stacked with a logic die 202 to form a memory device 100 according to various example embodiments. The memory device 100 incorporates one or more stacks of memory arrays 203 resulting in the stacked-die 3D memory array 200. Multiple memory arrays (e.g., the memory array 203) are fabricated onto each of a plurality of dies (e.g., the die 204). The memory array dies are then stacked to form the stacked-die 3D memory array 200.

Each die of the stack is divided into multiple "tiles" (e.g., the tiles 205A, 205B, and 205C associated with the stacked die 204). Each tile (e.g., the tile 205C) may include one or more memory arrays 203. The memory arrays 203 are not limited to any particular memory technology and may include dynamic random-access memory (DRAM), static random access memory (SRAM), flash memory, etc.

A stacked set of memory array tiles 208 may include a single tile from each of the stacked dies (e.g., the tiles 212B, 212C and 212D, with the base tile hidden from view in FIG. 1). Power, address, and/or data and similar common signals may traverse the stacked set of tiles 208 in the "Z" dimension 220 on conductive paths (e.g., the conductive path 224), such as "through-wafer interconnects" (TWIs). It is noted that a TWI need not necessarily pass entirely through a particular wafer or die.

The stacked-die 3D memory array 200 in one configuration is partitioned into a set of memory "vaults" (e.g., the memory vault 230). Each memory vault includes a stacked set of tiles (e.g., the set of tiles 208), one tile from each of a plurality of stacked dies, together with a set of TWIs to electrically interconnect the set of tiles 208. Each tile of the vault includes one or more memory arrays (e.g., the memory array 240). Although partitions into individual vaults 230 are described, the 3D memory array 200 can be partitioned in a number of other ways also. Other example partitions include partitioning by dies, tiles, etc.

A set of memory vaults 102, similar to the memory vaults 230 from FIG. 2, is illustrated in FIG. 1 in context within the memory device 100. The memory device 100 also includes a plurality 104 of memory vault controllers (MVCs) (e.g., the MVC 106). Each MVC is communicatively coupled to a corresponding memory vault (e.g., the memory vault 110 of the set 102) in a one-to-one relationship. Each MVC is thus capable of communicating with a corresponding memory vault independently from communications between other MVCs and their respective memory vaults.

The memory device 100 also includes a plurality of configurable serialized communication link interfaces (SCLIs) 112. The SCLIs 112 are divided into an outbound group of SCLIs 113 and an inbound group of SCLIs 115, where "outbound" and "inbound" directions are defined form the perspective of the processor(s) 114. Each SCLI of the plurality of SCLIs 112 is capable of concurrent operation with the other SCLIs. Together the SCLIs 112 communicatively couple the plurality of MVCs 104 to one or more host processor(s) 114. The memory device 100 presents a multi-link, high-throughput interface to the host processor(s) 114.

The memory device 100 may also include a switch 116. In some embodiments, the switch 116 may comprise a matrix switch which might also be referred to as a cross connect switch. The switch 116 is communicatively coupled to the plurality of SCLIs 112 and to the plurality of MVCs 104. The switch 116 is capable of cross-connecting each SCLI to a selected MVC. The host processor(s) 114 may thus access the plurality of memory vaults 102 across the plurality of SCLIs 112 in a substantially simultaneous fashion. This architecture can provide high processor-to-memory bandwidth for modern processor technologies, including multi-core technologies.

The memory device 100 may also include a memory fabric control register 117 coupled to the switch 116. The memory fabric control register 117 accepts memory fabric configuration parameters from a configuration source and configures one or more components of the memory device 100 to operate according to a selectable mode. For example, the switch 116 and each of the plurality of memory vaults 102 and the plurality of MVCs 104 may normally be configured to operate independently of each other in response to separate memory requests. Such a configuration can enhance memory system bandwidth as a result of the parallelism between the SCLIs 112 and the memory vaults 102.

Alternatively, the memory device 100 may be reconfigured via the memory fabric control register 117 to cause a subset of two or more of the plurality of memory vaults 102 and a corresponding subset of MVCs to operate synchronously in response to a single request. The latter configuration may be used to access a data word that is wider than the width of a data word associated with a single vault. Such a word is herein referred to as a wide data word. This technique may decrease latency. Other configurations may be enabled by loading a selected bit pattern into the memory fabric control register 117.

In one example the outbound SCLIs 113 may include a plurality of outbound differential pair serial paths (DPSPs) 128. The DPSPs 128 are communicatively coupled to the host processor(s) 114 and may collectively transport an outbound packet. The outbound SCLI 113 may also include a deserializer 130 coupled to the plurality of outbound DPSPs 128. The outbound SCLI may also include a demultiplexer 138 communicatively coupled to the deserializer 130. In one embodiment, the configuration of DSPSs, deserializers, and demultiplexers facilitates efficient transfer of data packets or sub-packets. Similar to the outbound SLCIs, in one embodiment, the inbound SCLIs and a similar configuration of DSPSs, serializers, and multiplexers facilitate efficient transfer of data packets or sub-packets.

Figure 3:
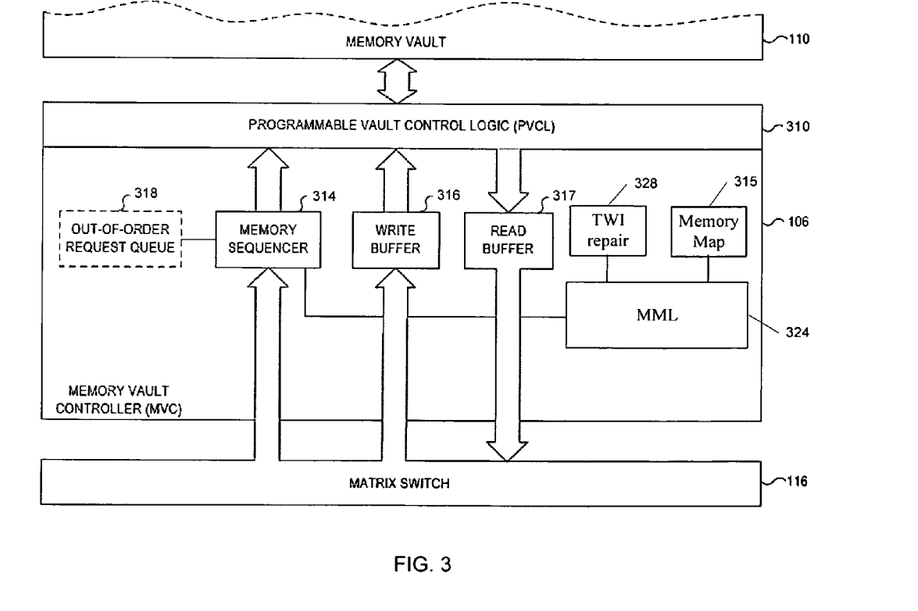
FIG. 3 shows a block diagram of a memory vault controller and associated modules according to an embodiment of the invention.

FIG. 3 is a block diagram of an MVC (e.g., the MVC 106) and associated modules according to various example embodiments. The MVC 106 may include a programmable vault control logic (PVCL) component 310. The PVCL 310 interfaces the MVC 106 to the corresponding memory vault (e.g., the memory vault 110). The PVCL 310 generates one or more control signals and/or timing signals associated with the corresponding memory vault 110.

The PVCL 310 may be configured to adapt the MVC 106 to a memory vault 110 of a selected configuration or a selected technology. Thus, for example, the memory device 100 may initially be configured using currently-available DDR2 DRAMs. The memory device 100 may subsequently be adapted to accommodate DDR3-based memory vault technology by reconfiguring the PVCL 310 to include DDR3 bank control and timing logic.

The MVC 106 may also include a memory sequencer 314 communicatively coupled to the PVCL 310. The memory sequencer 314 performs a memory technology dependent set of operations based upon the technology used to implement the associated memory vault 110. The memory sequencer 314 may, for example, perform command decode operations, memory address multiplexing operations, memory address demultiplexing operations, memory refresh operations, memory vault training operations, and/or memory vault prefetch operations associated with the corresponding memory vault 110. In some embodiments, the memory sequencer 314 may comprise a DRAM sequencer. In some embodiments, memory refresh operations may originate in a separate refresh controller (not shown).

The memory sequencer 314 may be configured to adapt the memory device 100 to a memory vault 110 of a selected configuration or technology. For example, the memory sequencer 314 may be configured to operate synchronously with other memory sequencers associated with the memory device 100. Such a configuration may be used to deliver a wide data word from multiple memory vaults to a cache line (not shown) associated with the host processor(s) 114 in response to a single cache line request.

The MVC 106 may also include a write buffer 316. The write buffer 316 may be coupled to the PVCL 310 to buffer data arriving at the MVC 106 from the host processor(s) 114. The MVC 106 may further include a read buffer 317. The read buffer 317 may be coupled to the PVCL 310 to buffer data arriving at the MVC 106 from the corresponding memory vault 110.

The MVC 106 may also include an out-of-order request queue 318. The out-of-order request queue 318 establishes an ordered sequence of read and/or write operations to the plurality of memory banks included in the memory vault 110. The ordered sequence is chosen to avoid sequential operations to any single memory bank in order to reduce bank conflicts and to decrease read-to-write turnaround time.

The MVC 106 may also include a memory map logic (MML) component 324. The MML 324 manages a number of operations such as TWI repair operations using TWI repair logic 328, or other repair operations. In one example, the MML 324 tracks multiple error data for multiple portions of the 3D memory array 200. Use of error data is discussed in more detail below. The error rate for a number of different portions can be tracked using the MML 324. In one example, error data is tracked for each die 204. Other examples include tracking error data for each tile 205, each array 203, etc.

In one example, portion being tracked is dynamic. For example, if a die 204 has an error rate that exceeds a threshold, then a portion of the die 204 may be selected for tracking. In another example, if an error rate is below a threshold error rate of a portion such as a tile, then the MVEL may only track an error rate for the vault that includes that tile. In one example, tracked error rate information for a portion of the 3D memory array 200 is used to adjust (e.g., vary) refresh rates of selected portions.

FIG. 3 shows an embodiment including a memory map 315. The memory map 315 interacts with the MML 324, keeps track of various portions of the 3D memory array 200, and stores characteristics such as error data that is associated with a tracked portion. Examples include tracking error data for individual dies 204, vaults 230, tiles 205, or other groupings of a number of memory cells within the 3D memory array 200. In one example the memory map 315 keeps track of such information for more than one portion concurrently. In one example, each MVC 106 includes a separate memory map 315, although the invention is not so limited. Other embodiments include a single memory map 315 on the logic chip 202, or other numbers of memory maps 315 to serve the 3D memory array 200.

Although error data is discussed as a characteristic that is tracked and used by the memory device 100, the invention is not so limited. Other characteristics specific to each portion are also tracked in various embodiments. Other characteristics may include, but are not limited to temperature, power down state, and refresh rate.

As discussed above, in one embodiment, the error data being tracked includes an error rate corresponding to an individual portion of the 3D memory array 200. Other error data such as error type, or cumulative errors are also possible error data. Error types include errors that are correctable using an error correction code (ECC), and hard errors such as a failed through wafer interconnect. In one embodiment, the error rate is compared to a threshold error rate. In one embodiment, if the threshold error rate is exceeded, the memory portion is considered in need of corrective action. Corrective action may include a number of approaches including implementing error correction algorithms, or removing a bad region from operation. Corrective action using repartitioning of the 3D memory array 200 is discussed in more detail below.

In one example the error data is collected once, and the corrective action is implemented as a static correction. For example, the memory device 100 may be evaluated once during a power up operation, and error data for various portions of the 3D memory array 200 is collected once. The memory map 315 is generated (e.g. created), and memory portions with errors that exceed a threshold level are removed from operation. The MML 324 then uses the memory map 315 to repartition the 3D memory array 200 from a first partition state that existed previous to power up to a second partition state that removes the bad memory portions from operation.

In another example, the error data is collected once just after manufacture, and the memory map 315 is generated to remove any defective memory portions due to manufacturing errors. Examples of manufacturing yield errors include failed vias, TWIs, other lithography defects etc. Other errors may be due to variations in silicon, or processing that produce functioning portions with higher than normal error rates. Such portions, functioning at lower than normal performance, are removed from operation in some embodiments, after first correcting the errors using ECC, then moving the data to a portion of the 3D memory array 200 that is functioning at least normal performance. After the data is moved, then the portion of the 3D memory array 200 with the unacceptable error rate is removed from use in the memory map 315, and the 3D memory array 200 is repartitioned.

In one example the error data is collected dynamically during operation of the memory device 100, and the corrective action is implemented dynamically in response to changing error data. Dynamically changing conditions of the 3D memory array 200 can be from a number of sources, including electromigration of conductors, thermal damage over time, etc. In dynamic embodiments, as a condition of an individual memory portion changes, the memory map 315 is updated, and corrective actions are implemented by the MML 324 as needed. Similar to embodiments described above, corrective actions include moving data, removing failed memory portions, and repartitioning the 3D memory array 200.

Figure 4:
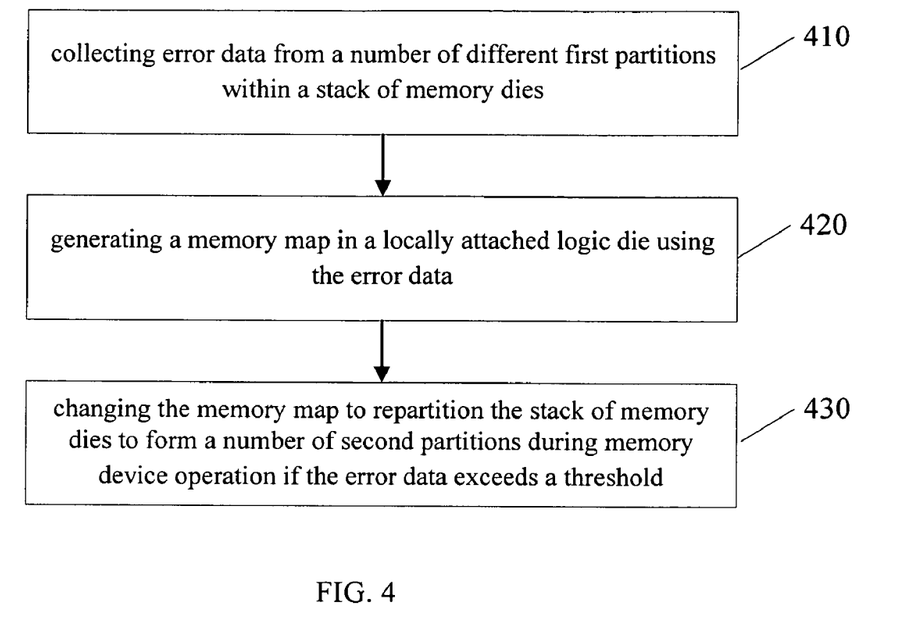
FIG. 4 shows a flow diagram of a method of operating a memory device according to an embodiment of the invention.

FIG. 4 illustrates a method of operating a memory including dynamic repartitioning of a 3D memory array 200. In operation 410, error data is collected from a number of different first partitions of a stack of memory dies. First partitions may correspond to some of the listed memory portions such as vaults 110, tiles 205, etc, however the invention is not so limited. Error data may include simply indicating that a first partition is not functioning, or the error data may include an error rate for a first partition. As discussed above, other types of error data are also possible.

In operation 420, a memory map 315 is generated (e.g., created) within a locally attached logic die such as logic die 202 using the error data collected in operation 410. In operation 430, the memory map 315 is changed to repartition the stack of memory dies to form a number of second partitions during operation of the memory device 100 if the error data exceeds a threshold.

Embodiments described above discuss removal of non-functioning partitions from operation. Other embodiments salvage portions of partitions that are still functional. In one embodiment, portions of first partitions that are still functional are combined to form second partitions. For example, if a TWI fails in a memory vault 110, the lower portion of the vault 110 may remain functional. Two or more lower portions of such vaults 110 can be combined and repartitioned to function as a whole vault in a second partition. In such an example, two or more memory sequencers 314 can be synched to operate as a single vault.

In one embodiment, the 3D memory array 200 is fabricated with spare memory portions. Examples of spare memory portions include spare memory dies 204, spare memory vaults 110, spare memory tiles 205, etc. In one example the spare memory regions are partitioned as spares in a first partition, and recorded as such in the memory map 315. In a static repartition memory example, upon power up, or after manufacture, if "primary" portions (as opposed to spare portions) of the 3D memory array 200 are bad, and removed from use, then one or more spare memory portions are mapped into use in the repartitioning process. Likewise, in a dynamic repartition memory example, during memory operation, once a memory portion meets removal criteria, such as error rate exceeding a threshold, an amount of spare memory portions necessary to make up the difference are mapped into use, and the 3D memory array 200 is repartitioned to include the spares.

In one example, after repartitioning, there may not be enough spare memory portions to bring the 3D memory array 200 back up to a particular memory capacity. For example, the 3D memory array 200 may end up short one or more vaults 110. In other embodiments without spare memory portions, any repartitioning will result in less memory capacity than was designed in manufacturing.

Figure 5:
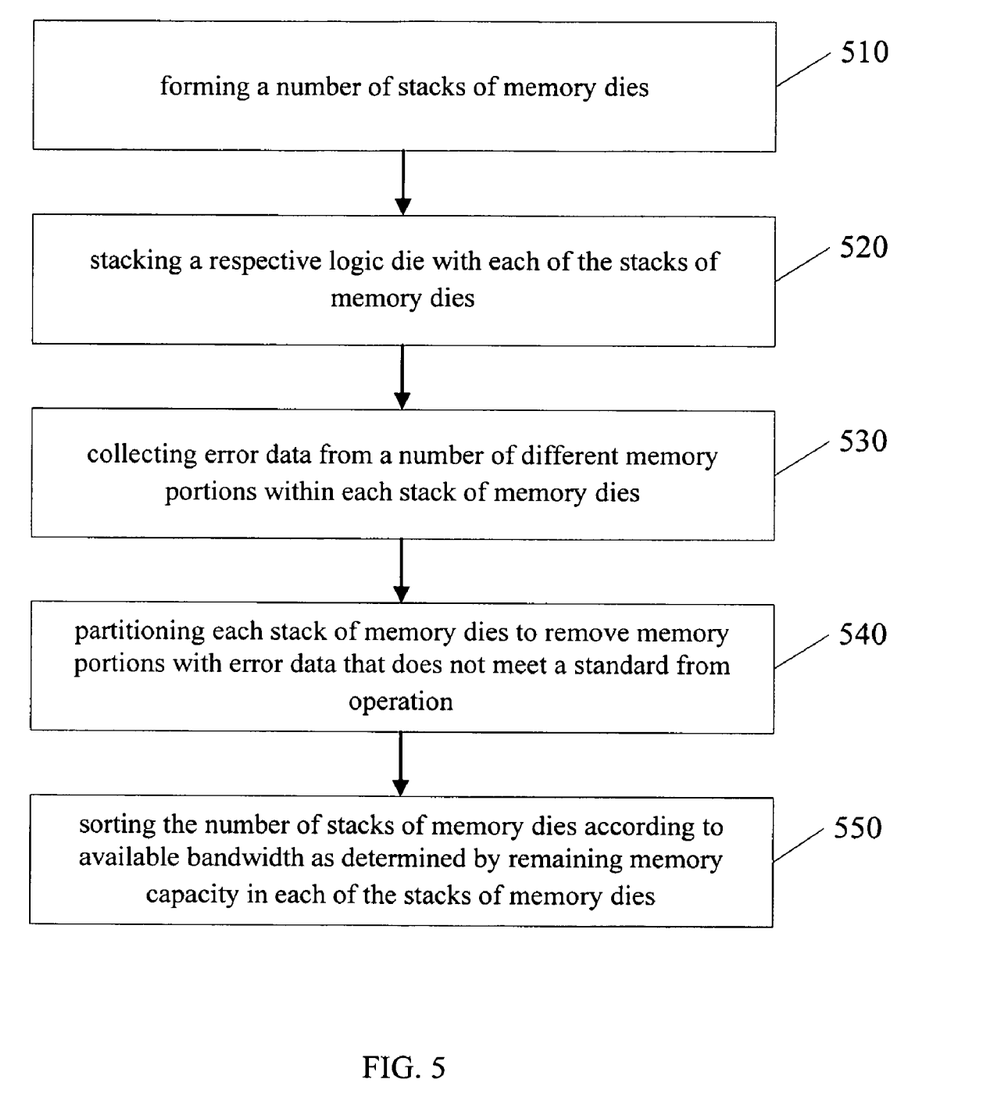
FIG. 5 shows a flow diagram of a method of making a memory device according to an embodiment of the invention.

FIG. 5 illustrates a manufacturing process that sorts memory after manufacture according to available bandwidth. In operation 510, a number of stacks of memory dies are formed, and in operation 520 a logic die is stacked with the stack of memory dies. Each stack of memory dies is manufactured with a first partition structure. Each stack of memory dies is then evaluated in operation 530 by collecting (e.g., gathering, generating, etc.) error data from different memory portions of the stacks of memory dies. In operation 540, each stack of memory dies is repartitioned to remove from operation memory portions with error data that does not meet a standard. As discussed in examples above, error data may not meet a standard if a portion of the stack of memory dies simply does not function. In other examples, error data may not meet a standard if an error rate exceeds a threshold error rate of a portion of the stack of memory dies.

In operation 550, the stacks of memory dies are sorted according to available bandwidth as determined by remaining memory capacity of each of the stacks of memory dies. As discussed above, in embodiments without spare memory portions, removal of a portion of the stack can result in the same read bandwidth, but the write bandwidth is slightly diminished. Even in embodiments with spare memory portions, the spare portions may be exceeded, and the resulting stack may have diminished bandwidth.

Sorting the stacks of memory dies according to available bandwidth is similar to sorting processors by demonstrated speed after manufacture. Stacks of memory dies can then be matched with a computing system that only requires the particular sorted memory bandwidth. For example, a personal computer can be marketed with a selected processor speed, and a selected memory bandwidth. The resulting combination will provide a computing speed based for the user than depends both on processor speed and memory bandwidth.

This method makes manufacturing yield less of an all or nothing issue for the memory manufacturer. A memory device 100 as described in embodiments above need not be perfect, and as a result of features such as an attached logic chip and a memory map, a large percentage of operational memory bandwidth is still available and can be marketed as such to an end user. Having the memory map 315 stored locally on the memory device 100 within a locally mounted logic chip 202 allows the memory device 100 to optimize memory operation independent of the processor 114.

The apparatus and systems of various embodiments may be useful in applications other than a high-density, multi-link, high-throughput semiconductor memory subsystem. Thus, various embodiments of the invention are not to be so limited. The illustrations of the memory device 100 are intended to provide a general understanding of the structure of various embodiments. They are not intended to serve as a complete description of all the elements and features of apparatus and systems that might make use of the structures described herein.

The novel apparatus and systems of various embodiments may comprise or be incorporated into electronic circuitry used in computers, communication and signal processing circuitry, single-processor or multi-processor modules, single or multiple embedded processors, multi-core processors, data switches, and other information handling systems.

Examples of such systems, include, but are not limited to televisions, cellular telephones, personal data assistants (PDAs), personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 6:
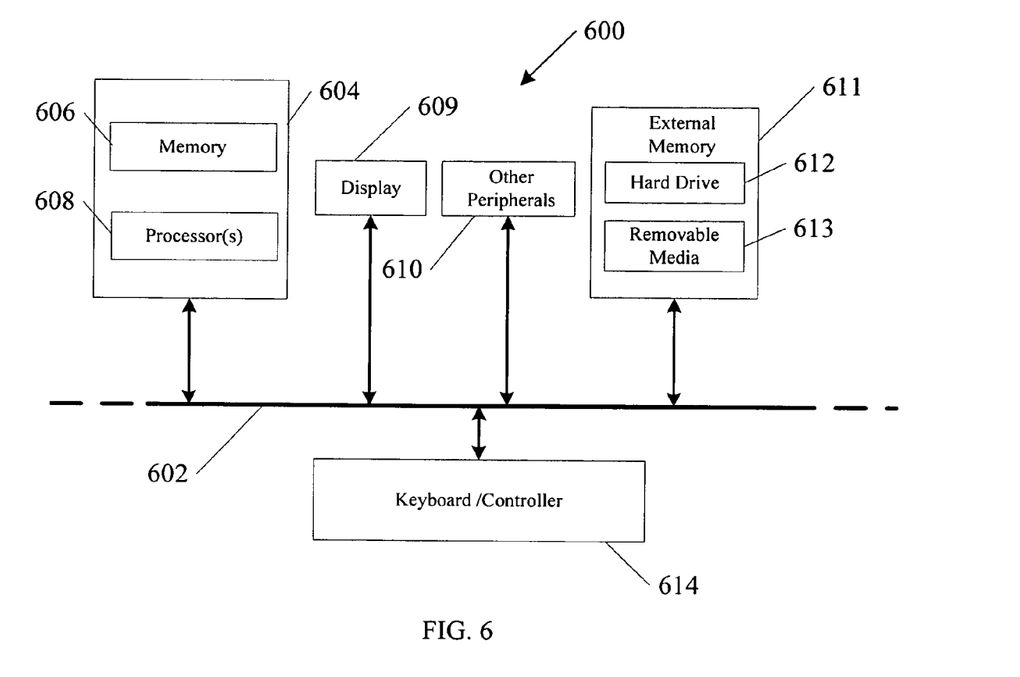
FIG. 6 shows a block diagram of an information handling system according to an embodiment of the invention.

A high level example of a personal computer is included in FIG. 6 to show a higher level device application for the present invention. FIG. 6 is a block diagram of an information handling system 600 incorporating at least one memory device 606 according to an embodiment of the invention.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 504 may include any circuit or operably compatible combination of circuits. In one embodiment, chip assembly 604 includes a processor 608 or multiple processors that can be of any type. As used herein, "processor" means any type of computational circuit such as, but not limited to, a microprocessor, a microcontroller, a graphics processor, a digital signal processor (DSP), or any other type of processor or processing circuit. As used herein, "processor" includes multiple processors or multiple processor cores.

In one embodiment, a memory device 606 is included in the chip assembly 604. Those skilled in the art will recognize that a wide variety of memory device configurations may be used in the chip assembly 604. A memory device such as a DRAM that is continually refreshed during operation is described in embodiments above. One example of a DRAM device includes a stacked memory chip 3D memory device with an integrated logic chip as described in embodiments above. Memory 606 can also include non-volatile memory such as flash memory.

Information handling system 600 may also include an external memory 611, which in turn can include one or more memory elements suitable to the particular application, such as one or more hard drives 612, and/or one or more drives that handle removable media 613 such as flash memory drives, compact disks (CDs), digital video disks (DVDs), and the like.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description.

What is claimed is:

1. A memory device, comprising:
a stack of partitioned memory dies; and
at least one logic die attached to a side of the stack of memory dies, the logic die including a memory map logic to repartition the stack of memory dies, wherein the memory map logic monitors dynamically sized partitions of the stack of partitioned memory dies, and a size of the partitions is adjustable as a function of error rate.

2. The memory device of claim 1, wherein the stack of memory dies is partitioned into vertical memory vaults.

3. The memory device of claim 2, wherein the memory vaults further include a number of spare memory vaults.

4. The memory device of claim 2, wherein the memory map logic combines portions of partially defective vaults together into a single partition.

5. The memory device of claim 1, wherein the memory map logic uses a memory map generated once at power up of the memory device.

6. The memory device of claim 1, wherein the memory map logic uses a memory map generated once after manufacture of the memory device.

7. A memory device, comprising:
   a stack of memory dies; and
   a logic die attached to a side of the stack of memory dies, the logic die including memory map logic to take corrective action with respect to the stack of memory dies as a function of tracked error data in different portions of the stack of memory dies;
   wherein the memory map logic monitors dynamically sized portions of the stack of memory dies, and wherein the size of the portions monitored is adjusted as a function of error rate.

8. The memory device of claim 7, wherein the logic die dynamically repartitions the stack of memory dies to remove from operation portions of the stack of memory dies with tracked error data that exceed an error threshold.

9. The memory device of claim 7, wherein the memory map logic is configured to concurrently track error data corresponding to multiple portions of the stack of memory dies.

10. The memory device of claim 7, wherein the tracked error data include errors that are correctable using an error correction code (ECC).

11. The memory device of claim 10, wherein the logic die is configured to move data to another portion of the stack of memory dies if the errors are correctable using an error correction code (ECC).

12. A memory device, comprising:
   a stack of memory dies, including:
      a number of primary portions; and
      at least one spare portion; and
   a logic die stacked with the stack of memory dies, the logic die including memory map logic to take corrective action with respect to the stack of memory dies if an error rate in one of the number of primary portions exceeds a threshold;
   wherein the memory map logic monitors dynamically sized portions of the stack of memory dies, and wherein the size of the portions monitored is adjusted as a function of error rate.

13. The memory device of claim 12, wherein the corrective action includes repartitioning the stack of memory dies.

14. The memory device of claim 12, wherein the number of primary portions include a number of memory vaults.

15. The memory device of claim 14, wherein the spare portion includes a memory vault.

16. The memory device of claim 12, wherein the number of primary portions include a number of memory tiles.

17. A method of operating a memory device, comprising:
   collecting error data from a number of different first partitions of a stack of memory dies;
   generating a memory map in a locally attached logic die using the error data;
   changing the memory map to repartition the stack of memory dies to form a number of second partitions during memory device operation if the error data exceeds a threshold.

18. The method of claim 17, wherein changing the memory map to repartition the stack of memory dies includes combining portions of a number of partially defective first partitions together into at least one second partition.

19. The method of claim 18, wherein combining portions of a number of partially defective first partitions together into at least one second partition includes combining portions of first memory vaults below a defective through wafer interconnect (TWI) together into at least one second partition.

* * * * *